United States Patent [19]
Jen

[11] Patent Number: 5,773,367
[45] Date of Patent: Jun. 30, 1998

[54] HIGH THROUGHPUT PLANARIZATION ETCH PROCESS FOR INTERLAYER OXIDE FILMS BETWEEN METALS AND PRE-METALS

[75] Inventor: Jang Jen, San Jose, Calif.

[73] Assignee: Integrated Device Technology, Inc., Santa Clara, Calif.

[21] Appl. No.: 709,568

[22] Filed: Sep. 6, 1996

[51] Int. Cl.⁶ ................................................. H01L 21/00
[52] U.S. Cl. ......................... 438/734; 438/697; 438/725; 438/722; 438/723; 216/38
[58] Field of Search ................... 438/697, 714, 438/725, 734, 735, 743, 719, 720, 721, 722, 723; 216/38; 430/313, 316, 317, 329

[56] References Cited

U.S. PATENT DOCUMENTS

| | | | |
|---|---|---|---|
| 4,732,658 | 3/1988 | Lee | 437/228 |
| 4,789,427 | 12/1988 | Fujimura et al. | 156/643 |
| 5,175,127 | 12/1992 | Manning | 437/195 |
| 5,180,689 | 1/1993 | Liu et al. | 437/228 |
| 5,212,117 | 5/1993 | Tsuji | 437/229 |
| 5,447,598 | 9/1995 | Mihara et al. | 216/46 |
| 5,525,192 | 6/1996 | Lee et al. | 156/651.1 |
| 5,549,784 | 8/1996 | Carmody et al. | 156/643.1 |
| 5,665,203 | 9/1997 | Lee et al. | 438/585 |

*Primary Examiner*—R. Bruce Breneman
*Assistant Examiner*—Luz Alejandro
*Attorney, Agent, or Firm*—Skjerven, Morrill, MacPherson, Franklin & Friel

[57] ABSTRACT

A method to planarize a partially completed semiconductor integrated device includes a first process to etch a first portion of a layer of photoresist on the device, a second process to etch the remaining layer of photoresist and to etch a first portion of an oxide on the device, and a third process to etch a second portion of the oxide layer on the device. The second process achieves an etch rate of approximately 5000 Å per minute and the third process achieves an etch rate of approximately 2000 Å per minute. The second process etches 80% of a targeted layer of oxide and the third process etches the remaining portion of the targeted layer of oxide.

12 Claims, 7 Drawing Sheets

HIGH THROUGHPUT PLANARIZATION ETCH PROCESS FOR INTERLAYER OXIDE FILMS BETWEEN METALS AND PRE-METALS

BACKGROUND OF THE INVENTION

1. Field of the Invention

This invention relates generally to a process for the planarization etch of integrated semiconductor devices and, more particularly, to a process to achieve high throughput for the planarization etch of integrated semiconductor devices and, even more particularly, to a process to achieve high throughput for the planarization etch of oxide/BPSG films in between the metal layers and pre-metal layers of a integrated semiconductor device.

2. Discussion of the Related Art

The increase of circuit density on silicon chips necessitates the increased ability to interconnect large numbers of integrated silicon devices on a single chip. The dimensional limitation of the active area in an integrated circuit dictates that vertical interconnections be made by means of multi-level metallization. As the circuits become denser, and the feature sizes smaller, the topography becomes too severe for conventional multilevel metallization structures to provide acceptable yield or to have acceptable reliability. It has been found that planarizing the dielectric between the metal interconnect layers improves the metal patterning and step coverage. This improved metal patterning and step coverage allows the use of multilevel metallization of large scale (LSI) and very large scale (VLSI) integrated circuits.

However, the necessity to provide for improved planarization of the interlayer oxide films have decreased the throughput of the wafers. For example, the process described in conjunction with FIGS. 1A–1C takes approximately 4 hours per 24 wafers and if there are added layers it would add 4 hours for each metal layer.

What is needed is a process to rapidly planarize the interlayer oxide films.

SUMMARY OF THE INVENTION

The present invention is directed to a method of planarizing a partially completed semiconductor integrated device including a first process to etch a first portion of a photoresist layer on the device, a second process to etch the remaining portion of the photoresist layer and a first portion of an oxide layer, and a third process to etch a second portion of the oxide layer.

The process parameters of the first process in one embodiment of the present invention includes:

a pressure of 2800±800 milliTorr;

a power of 600±200 watts;

an oxygen flow of 23±10 SCCM;

a flow of Freon 23 of 8±10 SCCM;

a flow of Freon 116 of 35±10 SCCM; and a flow of helium of 35±10 SCCM.

The process parameters of the second process in a second embodiment of the present invention includes:

a pressure of 1600±800 milliTorr;

a power of 750±200 watts;

an oxygen flow of 16±10 SCCM;

a flow of Freon 23 of 8±10 SCCM;

a flow of Freon 116 of 35±10 SCCM; and a flow of helium of 100±10 SCCM.

The process parameters of the third process in a third embodiment of the present invention includes:

a pressure of 1800±800 milliTorr;

a power of 500±200 watts;

an oxygen flow of 6±10 SCCM;

a flow of Freon 23 of 8±10 SCCM;

a flow of Freon 116 of 35±10 SCCM; and a flow of helium of 35±10 SCCM.

The process parameters of the first process in a fourth embodiment of the present invention includes:

a pressure of 2800±100 milliTorr;

a power of 600±50 watts;

an oxygen flow of 23±3 SCCM;

a flow of Freon 23 of 8±2 SCCM;

a flow of Freon 116 of 35±3 SCCM; and a flow of helium of 35±3 SCCM.

The process parameters of the second process in a fifth embodiment of the present invention includes:

a pressure of 1600±100 milliTorr;

a power of 750±50 watts;

an oxygen flow of 16±3 SCCM;

a flow of Freon 23 of 8±2 SCCM;

a flow of Freon 116 of 35±3 SCCM; and a flow of helium of 100±3 SCCM.

The process parameters of the third process in a sixth embodiment of the present invention includes:

a pressure of 1800±100 milliTorr;

a power of 500±50 watts;

an oxygen flow of 6±3 SCCM;

a flow of Freon 23 of 8±2 SCCM;

a flow of Freon 116 of 35±3 SCCM; and a flow of helium of 35±3 SCCM.

The present invention is directed to a method in which the second process achieves an etch rate of approximately 5000 Å per minute and wherein a selectivity of 1.5 oxide etch rate relative to 1.0 photoresist etch rate is maintained.

The present invention is directed to a method in which the third process achieves an etch rate of approximately 2000 Å per minute.

The present invention is directed to a method in which the second process etches 80% of a targeted level of the oxide layer on the device and wherein the third process etches the remaining portion of the targeted level of oxide.

The present invention is better understood upon consideration of the detailed description below, in conjunction with the accompanying drawings. As will become readily apparent to those skilled in this art from the following description there is shown and described embodiments of this invention simply by way of illustration of the best modes to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings.

DETAILED DESCRIPTION

Figure 1A:
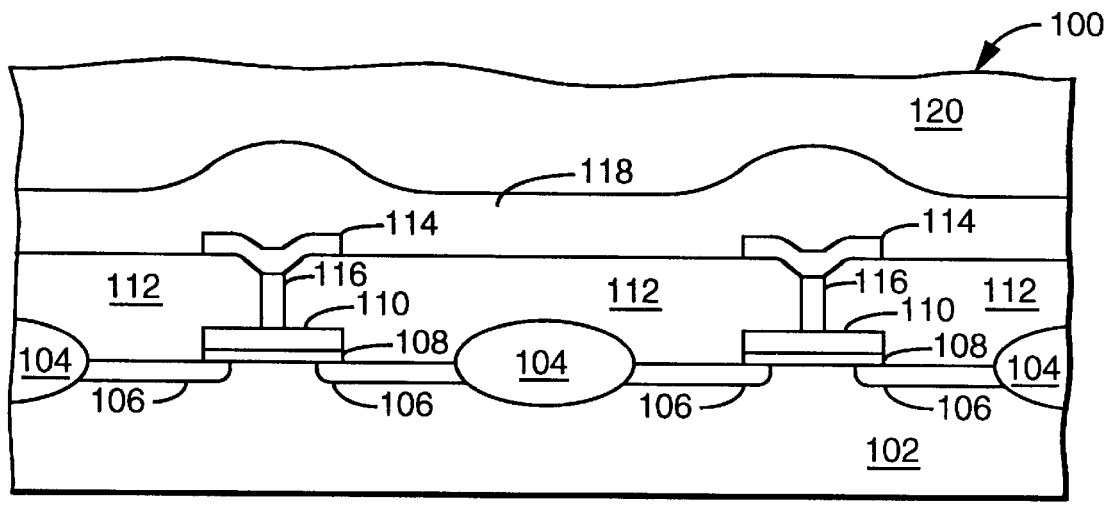
FIGS. 1A–1C show the prior art process.
Figure 1B:
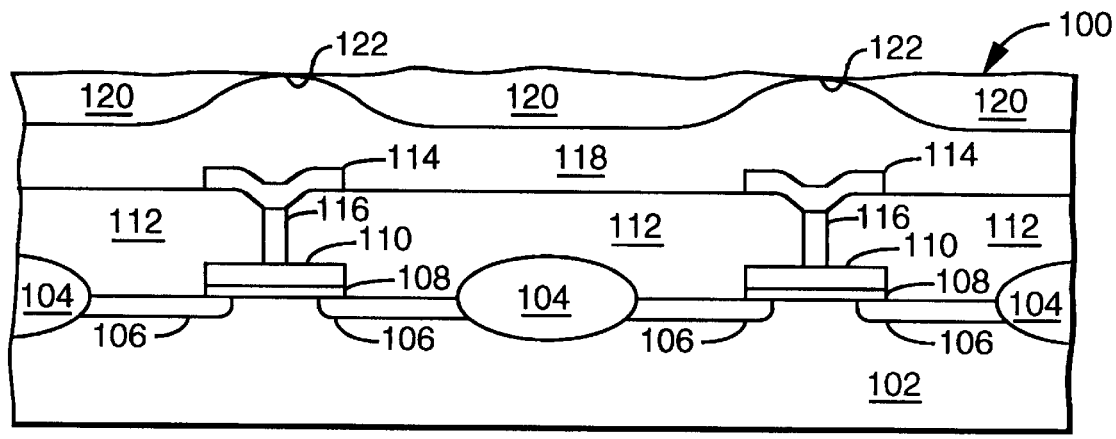
Figure 1C:
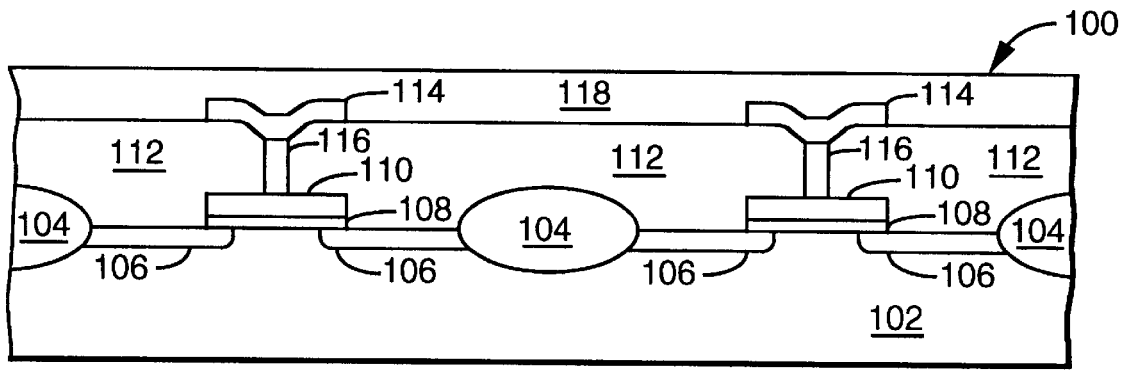

Referring to FIGS. 1A–1C, there is illustrated a device as manufactured in a prior art process. In FIG. 1A, there is shown a partially completed device 100 which includes a substrate 102, field oxide regions 104, source and drain regions 106, gate oxide regions 108, gate regions 110, and a dielectric region 112. Metal 1, indicated at 114, serves as electrical connections to the gate regions 110, which are connected to the gate regions 110 by vias indicated at 116. Over dielectric 112 and metal 1 layers 114 there is formed an oxide region 118 and over oxide region 118 there is formed a photoresist region 120. It is noted that not all of the components of a typical MOSFET device are shown in this and subsequent figures. For example, electrical connections to the source and drain regions are not shown and described.

Referring to FIG. 1B, partially completed device 100 is shown after the first process step of the prior art method is completed. It is noted that in FIG. 1B, like numerals denote like components. The first process step in the prior art comprises a process to etch the photoresist layer 120 to the peaks 122 of the oxide layer 118. This process step can be performed, for example, in a Tegal 903e plasma etcher available from the Tegal Company. The process parameters are as follows:

| Pressure | 2800 ± 100 millitorr |
|---|---|
| Power | 600 ± 50 watts |
| Oxygen | 23 ± 3 SCCM |
| Freon 23 | 8 ± 2 SCCM |
| Freon 116 | 35 ± 3 SCCM |
| Helium | 35 ± 3 SCCM |

In the above process, Freon 23 refers to $C_4F_3$ and Freon 116 refers to $C_2F_6$.

Referring to FIG. 1C, partially completed device 100 is shown after the second process of the prior art has been completed. The second process in the prior art comprises a process to planerize etch the remaining portions of the photoresist 120 and the oxide layer 118 to a region just above the metal layers 114. The distance above the metal layers 114 depends upon the device parameters and the process parameters and is set by the process designer. This process step can be performed, for example, in a Tegal 903e plasma etcher. The process parameters for the second process are as follows:

| Pressure | 1800 ± 100 milliTorr |
|---|---|
| Power | 500 ± 50 watts |
| Oxygen | 6 ± 3 SCCM |
| Freon 23 | 8 ± 2 SCCM |
| Freon 116 | 35 ± 3 SCCM |
| Helium | 35 ± 3 SCCM |

This process step provided an oxide etch rate of 2000 Å/minute and a resist etch rate of 1300 Å/minute. At these etch rates it took approximately 3–4 hours to etch a 24 wafer lot. This planarization etch rate comprised a major bottleneck in the process throughput.

Figure 2A:
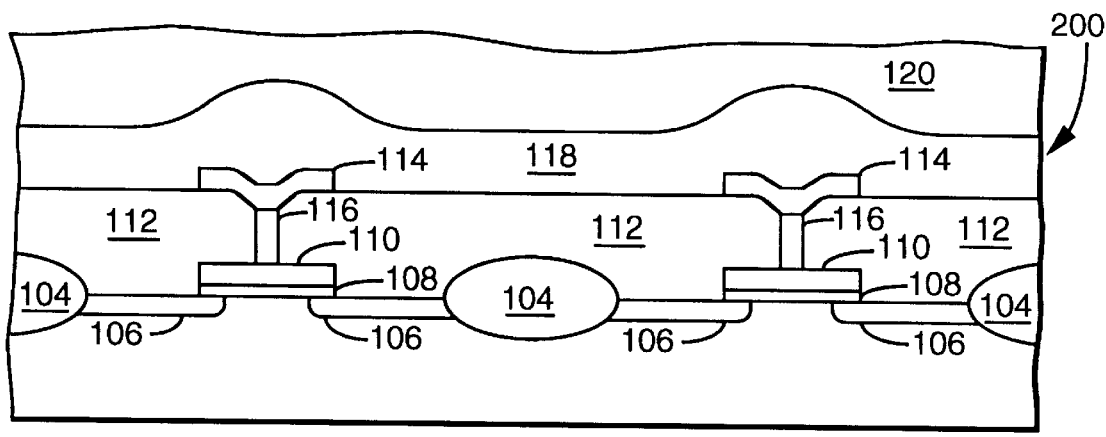
FIGS. 2A–2D show the process as taught by the present invention.

Referring to FIG. 2A, there is shown a partially formed device 200 in substantially the same stage of completion as the partially formed device 100 shown in FIG. 1A. It is noted that like numerals in this and subsequent figures denote like components.

Figure 2B:
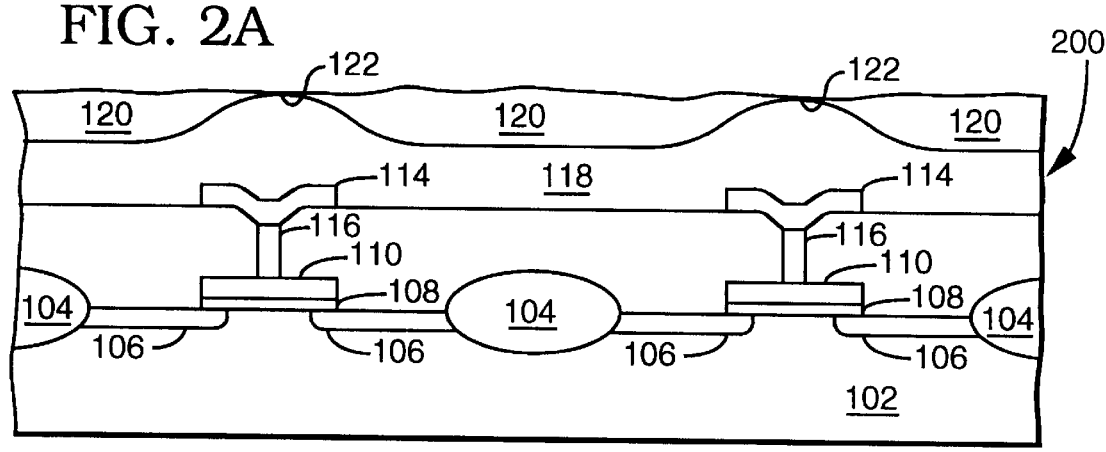

Referring to FIG. 2B, partially completed device 200 is shown after the first process step is completed. It is noted that the first process step in the present invention is substantially the same process step as described in the prior art and is a process step to remove the photoresist layer 120 to the peaks 122 of the oxide layer 118. This process step can be performed, for example, in a Tegal 903e plasma etcher available from the Tegal Company. The process parameters are as follows:

| Pressure | 2800 ± 100 millitorr |
|---|---|
| Power | 600 ± 50 watts |
| Oxygen | 23 ± 3 SCCM |
| Freon 23 | 8 ± 2 SCCM |
| Freon 116 | 35 ± 3 SCCM |
| Helium | 35 ± 3 SCCM |

In the above process, Freon 23 refers to $C_4F_3$ and Freon 116 refers to $C_2F_6$.

Figure 2C:
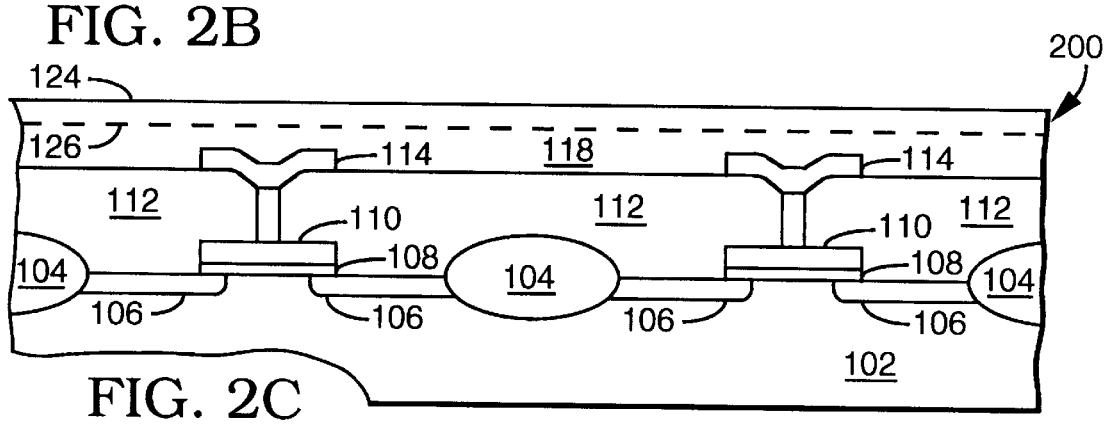

Referring to FIG. 2C, partially completed device 200 is shown after the second process of the present invention has been completed. The second process of the present invention comprises a process to rapidly etch the remaining photoresist layer 120 and the oxide layer 118 to a level, indicated at 124, which is approximately 80% of the distance to the target level, indicated at 126. The target level 126 is the level that the process designer designates as the level at which a sufficient layer of oxide remains over the metal layers 114. This second process of the present invention, can be performed in a Tegal 903e plasma etcher. The process parameters are as follows:

| Pressure | 1600 ± 100 milliTorr |
|---|---|
| Power | 750 ± 50 watts |
| Oxygen | 16 ± 3 SCCM |
| Freon 23 | 108 ± 2 SCCM |
| Freon 116 | 35 ± 3 SCCM |
| Helium | 100 ± 3 SCCM |

The above process is halted when the etch has reached 80% of the targeted level. This second process achieves an oxide etch rate of approximately 5500 Å per minute and a photoresist etch rate of approximately 3600 Å per minute with a selectivity of 1.5±0.2 oxide etch rate to photoresist etch rate.

Figure 2D:
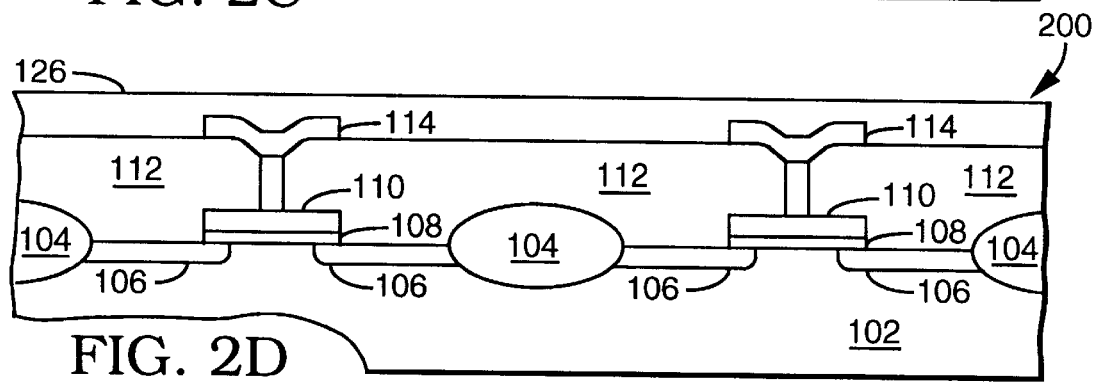

Referring to FIG. 2D, partially completed device 200 is shown after the third process of the present invention has been completed. The third process of the present invention comprises a process to etch a portion of the remaining oxide 118 down to the target level, indicated at 126. The third process of the present invention can be performed, for example, in a Tegal 903e plasma etcher. The process parameters for the third process are as follows:

| | |
|---|---|
| Pressure | 1800 ± 100 milliTorr |
| Power | 500 ± 50 watts |
| Oxygen | 6 ± 3 SCCM |
| Freon 23 | 8 ± 2 SCCM |
| Freon 116 | 35 ± 3 SCCM |
| Helium | 35 ± 3 SCCM |

Figure 3A:
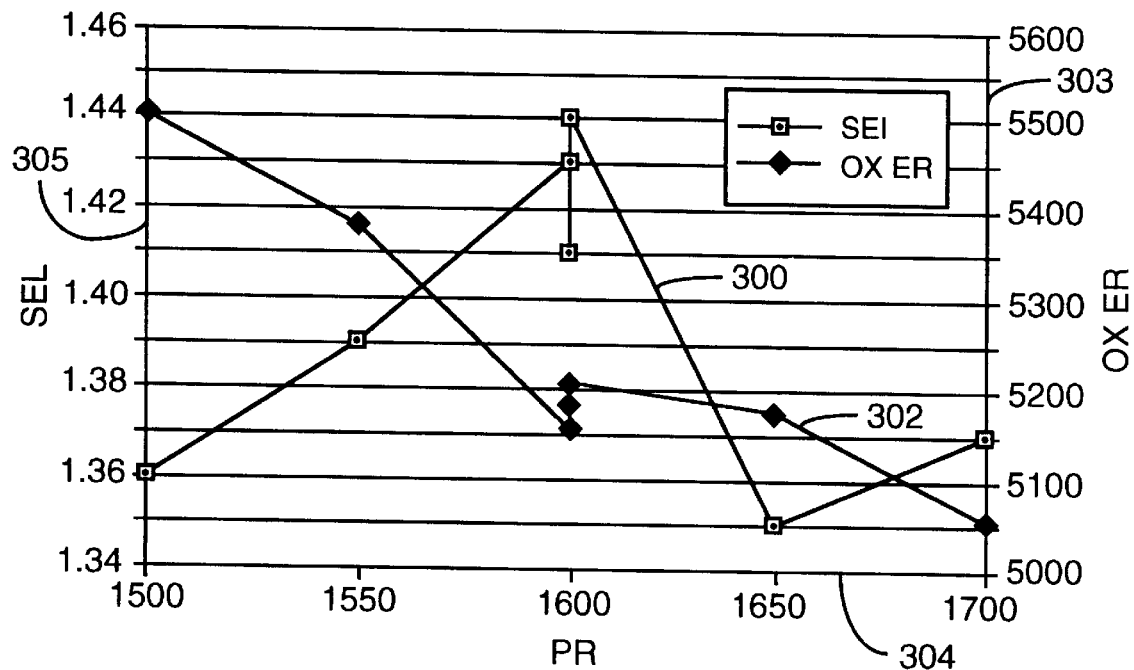
FIG. 3A shows the selectivity and the oxide etch rate data varying with photoresist etch rate.

Referring to FIG. 3A, there is shown (1) the selectivity 300 of the oxide etch rate relative to the photoresist etch rate (the selectivity defines the relative material etching rate of one material to another), with values of the selectivity 300 indicated on the left ordinate 305, (2) the oxide etch rate 302 in Å/min (angstroms per minute), with values of the oxide etch rate 302 indicated on the right ordinate 303, and (3) the photoresist etch rate with values indicated on the abscissa 304 in Å/min.

Figure 3B:
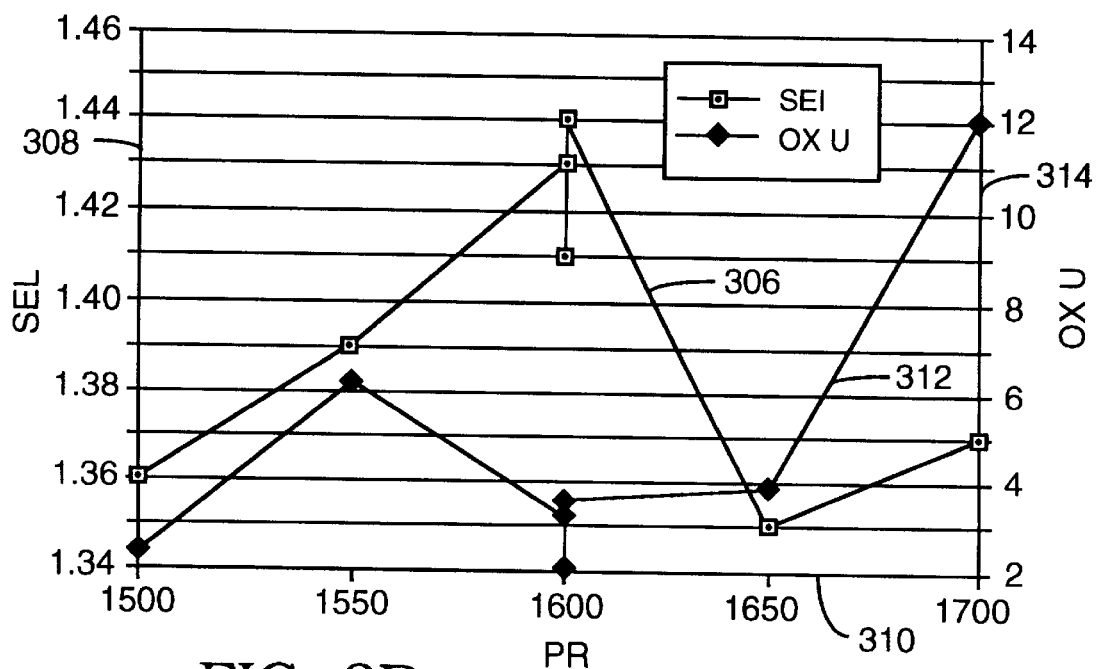
FIG. 3B shows the selectivity and oxide uniformity data varying with photoresist etch rate.

Referring to FIG. 3B, there is shown (1) the selectivity 306 of the oxide etch rate relative to the photoresist etch rate, with values of the selectivity 306 indicated on the left ordinate 308, with values of the photoresist etch rate indicated on the abscissa 310 in Å/min and (2) the oxide uniformity 312 with values indicated on the right ordinate 314 in units of percentage.

Figure 4A:
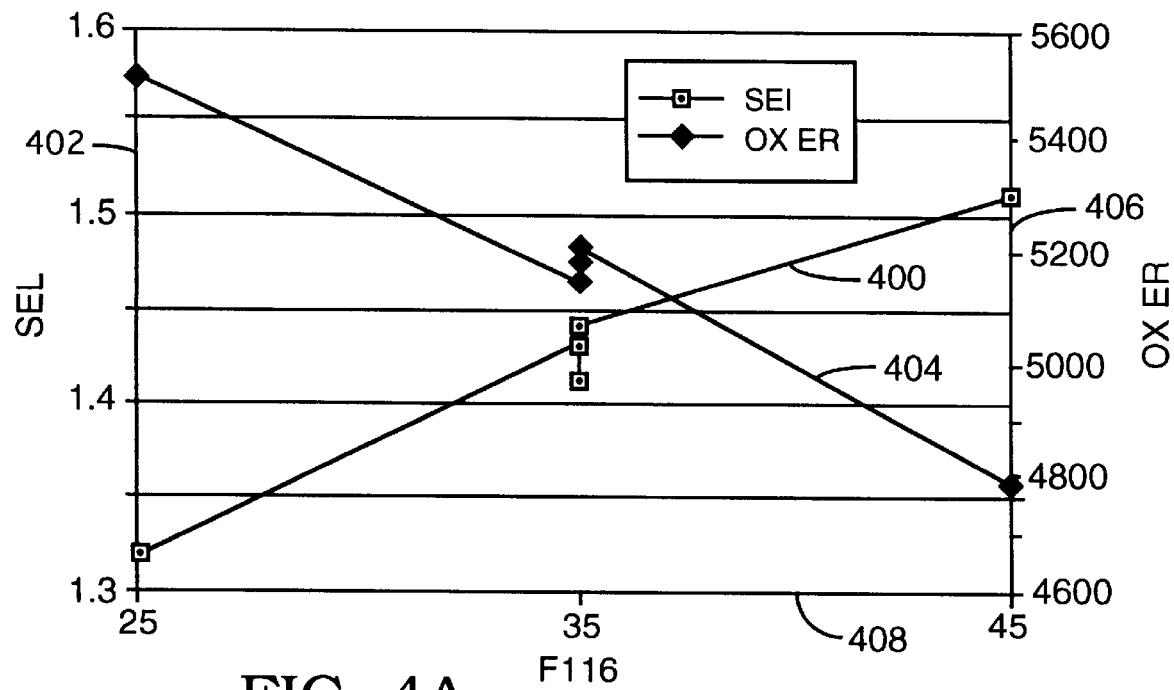
FIG. 4A shows the selectivity and oxide etch rate data varying with Freon 116 flow rate.

Referring to FIG. 4A, there is shown (1) the selectivity 400 of the oxide etch rate relative to the photoresist etch rate, with values of the selectivity 400 indicated on the left ordinate 402, (2) the oxide etch rate 404, with values indicated on the right ordinate 406 in Å/min, and (3) the flow rate of Freon 116 gas, indicated on the abscissa 408 in SCCM (cubic meter per second).

Figure 4B:
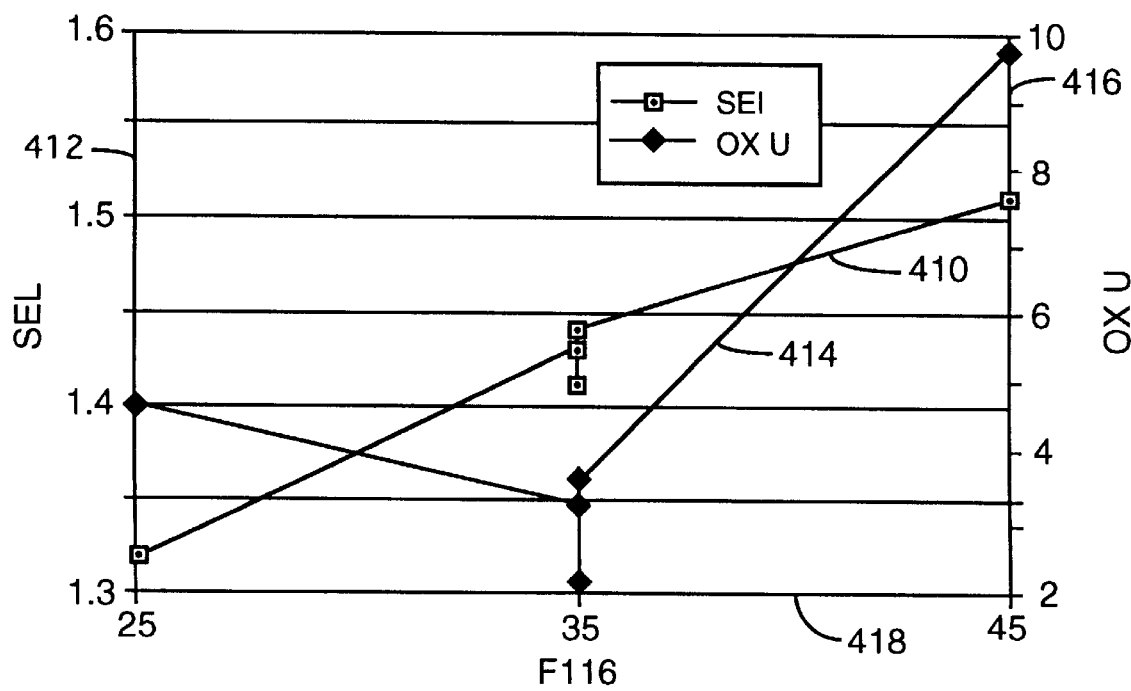
FIG. 4B shows the selectivity and oxide uniformity data varying with Freon 116 flow rate.

Referring to FIG. 4B, there is shown (1) the selectivity 410 of the oxide etch rate relative to the photoresist etch rate, with values of the selectivity 410 indicated on the left ordinate 412, (2) the oxide uniformity 414, with values indicated on the right ordinate 416 in percentage units, and (3) the flow rate of Freon 116 gas, indicated on the abscissa 418 in SCCM.

Figure 5A:
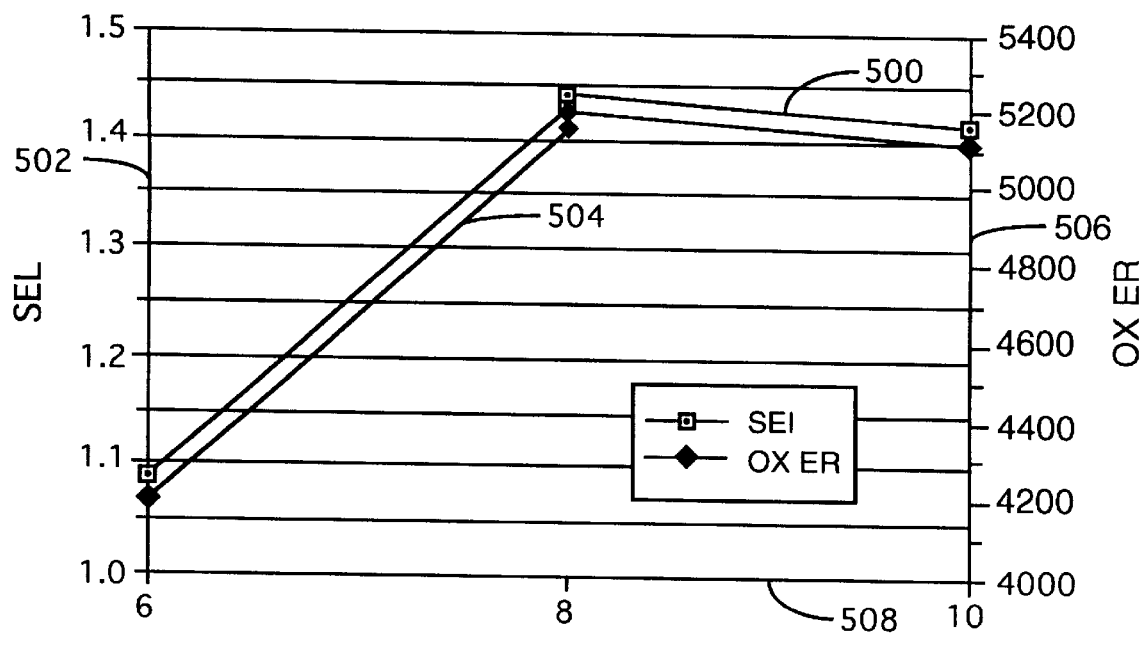
FIG. 5A shows the selectivity and oxide etch rate data varying with Freon 23 flow rate.

Referring to FIG. 5A, there is shown (1) the selectivity 500 of the oxide etch rate relative to the photoresist etch rate, with values of the selectivity 500 indicated on the left ordinate 502, (2) the oxide etch rate 504, with values indicated on the right ordinate 506 in Å/min, and (3) the flow rate of Freon 23 gas, indicated on the abscissa 508 in SCCM.

Figure 5B:
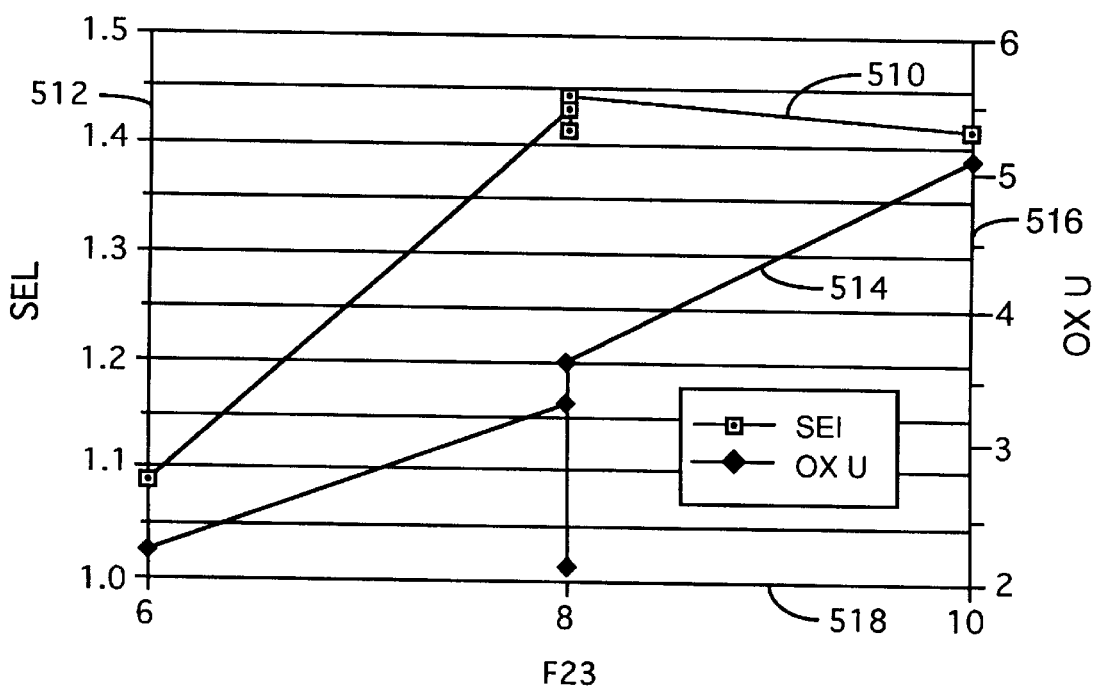
FIG. 5B shows the selectivity and oxide uniformity data varying with Freon 23 flow rate.

Referring to FIG. 5B, there is shown (1) the selectivity 510 of the oxide etch rate relative to the photoresist etch rate, with values of the selectivity 510 indicated on the left ordinate 512, (2) the oxide uniformity 514, with values indicated on the right ordinate 516 in percentage units, and (3) the flow rate of Freon 23 gas, indicated on the abscissa 518 in SCCM.

Figure 6A:
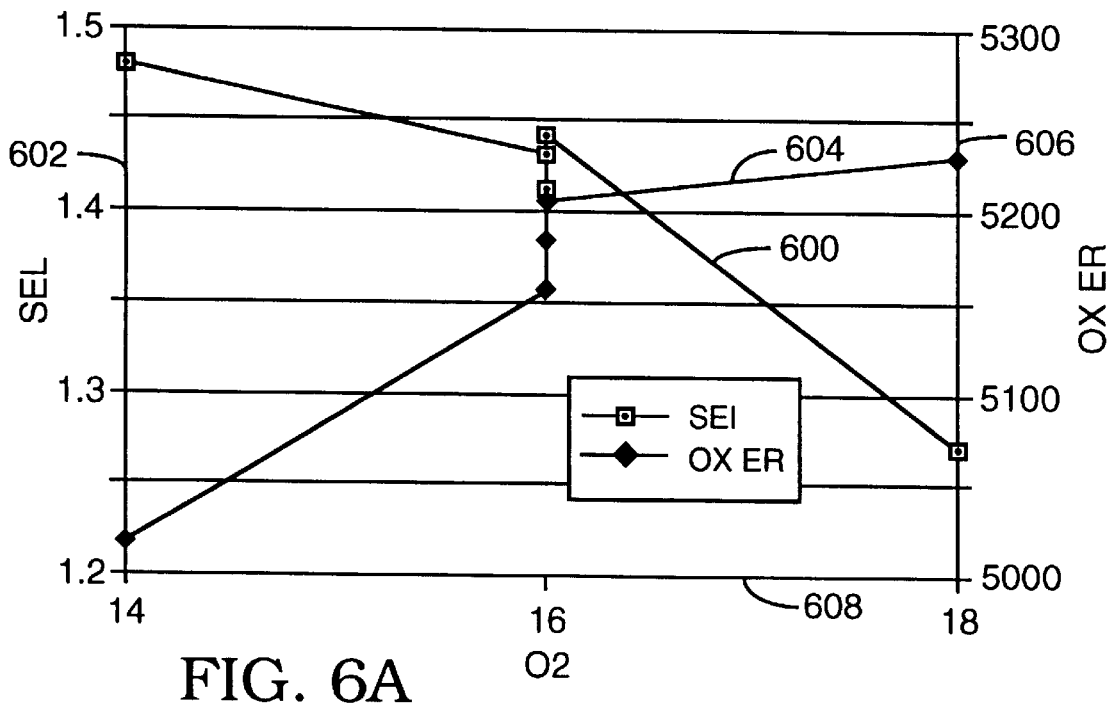
FIG. 6A shows the selectivity and oxide etch rate data varying with oxygen flow rate.

Referring to FIG. 6A, there is shown (1) the selectivity 600 of the oxide etch rate relative to the photoresist etch rate, with values of the selectivity 600 indicated on the left ordinate 602, (2) the oxide etch rate 604 with values indicated on the right ordinate 606 in Å/min, and (3) the flow rate of oxygen, indicated on the abscissa 608 in SCCM.

Figure 6B:
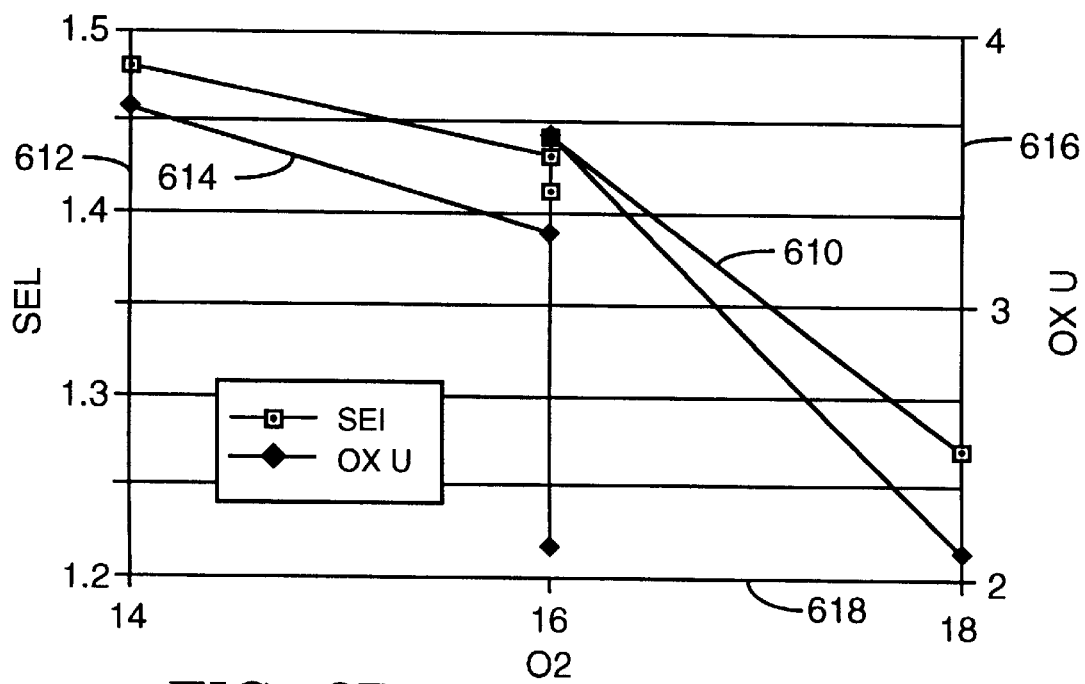
FIG. 6B shows the selectivity and oxide uniformity data varying with oxygen flow rate.

Referring to FIG. 6B, there is shown (1) the selectivity 610 of the oxide etch rate relative to the photoresist etch rate, with values of the selectivity 610 indicated on the left ordinate 612, (2) the oxide uniformity 614, with values indicated on the right ordinate 616 in percentage units, and (3) the flow rate of oxygen, indicated on the abscissa 618 in SCCM.

Figure 7A:
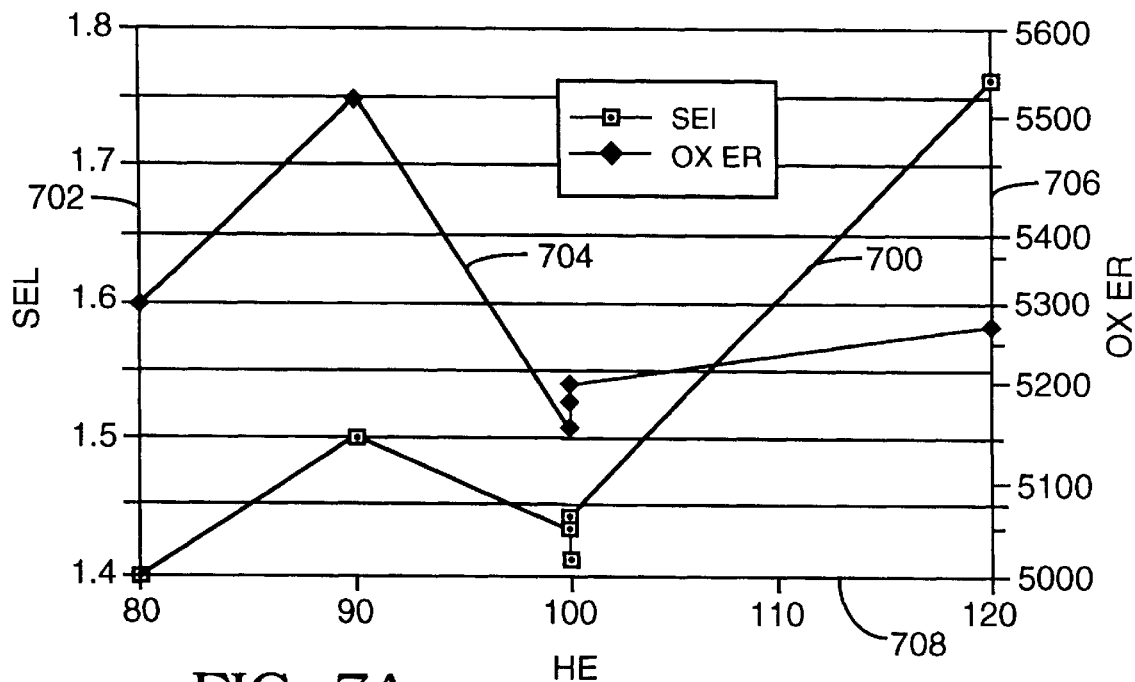
FIG. 7A shows the selectivity and oxide etch rate data varying with helium flow rate.

Referring to FIG. 7A, there is shown (1) the selectivity 700 of the oxide etch rate relative to the photoresist etch rate, with values of the selectivity 700 indicated on the left ordinate 702, (2) the oxide etch rate 704, with values indicated on the right ordinate 706 in Å/min, and (3) the flow rate of helium, indicated on the abscissa 708 in SCCM.

Figure 7B:
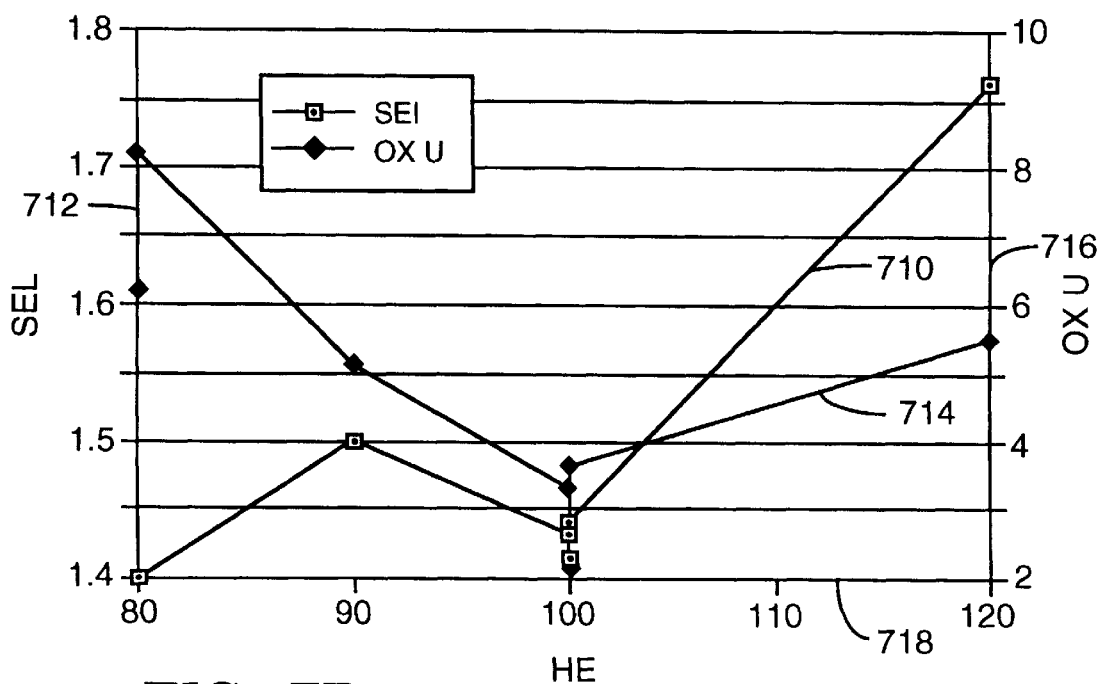
FIG. 7B shows the selectivity and oxide uniformity data varying with helium flow rate.

Referring to FIG. 7B, there is shown (1) the selectivity 710 of the oxide etch rate relative to the photoresist etch rate, with values of the selectivity 710 indicated on the left ordinate 712, (2) the oxide uniformity 714, with values indicated on the right ordinate 716 in percentage units, and (3) the flow rate of helium, indicated on the abscissa 718 in SCCM.

The foregoing description of the preferred embodiment of the invention has been presented for purposes of illustration and description. It is not intended to be exhaustive or to limit the invention to the precise process disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What I claim is:

1. A method to planarize a partially completed semiconductor integrated device, comprising:

a first process to etch a first portion of a layer of photoresist on the device;

a second process to etch a remaining portion of the photoresist and to etch a first portion of an oxide layer on the device; and a third process to etch a second portion of the oxide layer on the device.

2. The method of claim 1, wherein the first process comprises the process parameters:

a pressure of 2800±800 milliTorr;

a power of 600±200 watts;

an oxygen flow of 23±10 SCCM;

a flow of Freon 23 of 8±10 SCCM;

a flow of Freon 116 of 35±10 SCCM; and a flow of helium of 35±10 SCCM.

3. The method of claim 1, wherein the second process comprises the process parameters:

a pressure of 1600±800 milliTorr;

a power of 750±200 watts;

an oxygen flow of 16±10 SCCM;

a flow of Freon 23 of 8±10 SCCM;

a flow of Freon 116 of 35±10 SCCM; and a flow of helium of 100±10 SCCM.

4. The method of claim 1, wherein the third process comprises the process parameters:

a pressure of 1800±800 milliTorr;

a power of 500±200 watts;

an oxygen flow of 6±10 SCCM;

a flow of Freon 23 of 8±10 SCCM;

a flow of Freon 116 of 35±10 SCCM; and a flow of helium of 35±10 SCCM.

5. The method of claim 1, wherein the first process comprises the process parameters:

a pressure of 2800±100 milliTorr;

a power of 600±50 watts;

an oxygen flow of 23±3 SCCM;

a flow of Freon 23 of 8±2 SCCM;

a flow of Freon 116 of 35±3 SCCM; and a flow of helium of 35±3 SCCM.

6. The method of claim 1, wherein the second process comprises the process parameters:

a pressure of 1600±100 milliTorr;

a power of 750±50 watts;

an oxygen flow of 16±3 SCCM;

a flow of Freon 23 of 8±2 SCCM;

a flow of Freon 116 of 35±3 SCCM; and a flow of helium of 100±3 SCCM.

7. The method of claim 1, wherein the third process comprises the process parameters:

a pressure of 1800±100 milliTorr;

a power of 500±50 watts;

an oxygen flow of 6±3 SCCM;

a flow of Freon 23 of 8±2 SCCM;

a flow of Freon 116 of 35±3 SCCM; and a flow of helium of 35±3 SCCM.

8. The method of claim 1, wherein the second process achieves an etch rate of approximately 5000 Å per minute.

9. The method of claim 8, wherein the second process achieve a selectivity of 1.5 oxide etch rate relative to 1.0 photoresist etch rate.

10. The method of claim 1, wherein the third process achieves an oxide etch rate of approximately 2000 Å per minute.

11. The method of claim 1, wherein the second process etches 80% of a targeted level of the oxide layer on the device.

12. The method of claim 11, wherein the third process etches a remaining targeted level of the oxide layer on the device.

* * * * *